(12) United States Patent
Chen et al.

(10) Patent No.: US 12,166,009 B2
(45) Date of Patent: Dec. 10, 2024

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Tang-Yuan Chen, Kaohsiung (TW);
Meng-Kai Shih, Kaohsiung (TW);
Teck-Chong Lee, Kaohsiung (TW);
Shin-Luh Tarng, Kaohsiung (TW);
Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/239,722

(22) Filed: Aug. 29, 2023

(65) Prior Publication Data

US 2023/0411349 A1 Dec. 21, 2023

Related U.S. Application Data

(63) Continuation of application No. 17/322,764, filed on May 17, 2021, now Pat. No. 11,742,324, which is a
(Continued)

(51) Int. Cl.
*H01L 25/065* (2023.01)
*H01L 21/56* (2006.01)
(Continued)

(52) U.S. Cl.
CPC ........ *H01L 25/0652* (2013.01); *H01L 21/566* (2013.01); *H01L 23/5283* (2013.01);
(Continued)

(58) Field of Classification Search
CPC ............... H01L 25/0652; H01L 21/566; H01L 23/5283; H01L 24/17; H01L 24/33;
(Continued)

(56) References Cited

U.S. PATENT DOCUMENTS 10,134,677 B1 11/2018 Chang Chien et al.
11,011,496 B2 5/2021 Chen et al.
(Continued)

OTHER PUBLICATIONS

Non-Final Office Action for U.S. Appl. No. 16/563,716, issued Sep. 15, 2020, 11 pages.
(Continued)

*Primary Examiner* — Tong-Ho Kim
(74) *Attorney, Agent, or Firm* — FOLEY & LARDNER LLP

(57) ABSTRACT

A semiconductor device package includes a first conductive layer, a second conductive layer and a third conductive layer. The first conductive layer has a first pitch. The second conductive layer has a second pitch and is arranged at two different sides of the first conductive layer. The third conductive layer has a third pitch and is disposed above the first conductive layer and the second conductive layer. The third conductive layer is electrically connected to the first conductive layer. The first pitch is smaller than the third pitch, and the third pitch is smaller than the second pitch.

18 Claims, 21 Drawing Sheets

Related U.S. Application Data continuation of application No. 16/563,716, filed on Sep. 6, 2019, now Pat. No. 11,011,496.

(51) Int. Cl.
*H01L 23/00* (2006.01)
*H01L 23/528* (2006.01)

(52) U.S. Cl.
CPC ............. *H01L 24/17* (2013.01); *H01L 24/33* (2013.01); *H01L 24/73* (2013.01); *H01L 2224/0231* (2013.01); *H01L 2224/02373* (2013.01); *H01L 2224/02381* (2013.01); *H01L 2224/73253* (2013.01); *H01L 2924/3511* (2013.01); *H01L 2924/381* (2013.01)

(58) Field of Classification Search
CPC ............. H01L 24/73; H01L 2224/0231; H01L 2224/02373; H01L 2224/02381; H01L 2224/73253; H01L 2924/3511; H01L 2924/381; H01L 24/16; H01L 24/32; H01L 24/81; H01L 24/83; H01L 24/92; H01L 24/19; H01L 2224/04105; H01L 2224/12105; H01L 2224/16238; H01L 2224/214; H01L 2224/24137; H01L 2224/32225; H01L 2224/73204; H01L 2224/81005; H01L 2924/1433; H01L 2924/1434; H01L 2924/15311; H01L 21/4857; H01L 23/3128; H01L 23/49816; H01L 21/56; H01L 23/5385; H01L 25/0655; H01L 21/568; H01L 2221/68345; H01L 2224/83005; H01L 2224/92125; H01L 2924/15192; H01L 2924/18161; H01L 2924/19041; H01L 2924/19043; H01L 2924/19105; H01L 21/6835; H01L 21/561; H01L 25/072
USPC ........................................................ 257/690
See application file for complete search history.

(56) References Cited

U.S. PATENT DOCUMENTS

| | | | |
|---|---|---|---|
| 11,742,324 B2* | 8/2023 | Chen | .................... H01L 23/5385 257/690 |
| 2014/0185264 A1 | 7/2014 | Chen et al. | |
| 2016/0198568 A1* | 7/2016 | Park | ...................... H05K 3/4682 174/262 |
| 2016/0302308 A1 | 10/2016 | Lee et al. | |
| 2019/0206792 A1 | 7/2019 | Collins et al. | |

OTHER PUBLICATIONS

Non-Final Office Action for U.S. Appl. No. 17/322,764, issued Dec. 20, 2022, 21 pages.
Notice of Allowance for U.S. Appl. No. 16/563,716, issued, Jan. 19, 2021, 8 pages.
Notice of Allowance for U.S. Appl. No. 17/322,764, issued Apr. 11, 2023, 8 pages.

* cited by examiner

SEMICONDUCTOR DEVICE PACKAGES AND METHODS OF MANUFACTURING THE SAME

CROSS-REFERENCE TO RELATED APPLICATIONS

The present application is a continuation of U.S. application Ser. No. 17/322,764 filed May 17, 2021, now U.S. Pat. No. 11,742,324, which is a continuation of U.S. patent application Ser. No. 16/563,716, filed Sep. 6, 2019, now U.S. Pat. No. 11,011,496 the contents of which are incorporated herein by reference in their entireties.

BACKGROUND

1. Field of the Disclosure

The present disclosure relates to, amongst other things, semiconductor device packages and methods of manufacturing the same.

The present disclosure relates to, amongst other things, semiconductor device packages and methods of manufacturing the same.

2. Description of Related Art

A semiconductor device package may include some semiconductor devices stacked to one another. However, wafer warpage or high thickness may adversely affect performance and efficiency of the semiconductor device package.

SUMMARY

According to some example embodiments of the instant disclosure, a semiconductor device package includes a first conductive layer, a second conductive layer and a third conductive layer. The first conductive layer has a first pitch. The second conductive layer has a second pitch and is arranged at two different sides of the first conductive layer. The third conductive layer has a third pitch and is disposed above the first conductive layer and the second conductive layer. The third conductive layer is electrically connected to the first conductive layer. The first pitch is smaller than the third pitch, and the third pitch is smaller than the second pitch.

According to some example embodiments of the instant disclosure, a semiconductor device package includes a first conductive layer, a first dielectric layer, a second conductive layer, a second dielectric layer and a third conductive layer. The first dielectric layer covers the first conductive layer. The second conductive layer is disposed at two different sides of the first dielectric layer. The third conductive layer is disposed over the first conductive layer and the second conductive layer. The second dielectric layer covers the first conductive layer, the first dielectric layer, the second conductive layer and at least a portion of the third conductive layer. A hardness of the first dielectric layer is larger than a hardness of the second dielectric layer.

According to some example embodiments of the instant disclosure, a method of manufacturing a semiconductor device package includes providing a carrier; disposing a first conductive layer on the carrier; disposing two second conductive layers at different sides of the first conductive layer on the carrier; disposing a third conductive layer above the first conductive layer and the second conductive layers; and connecting two dies to the third conductive layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
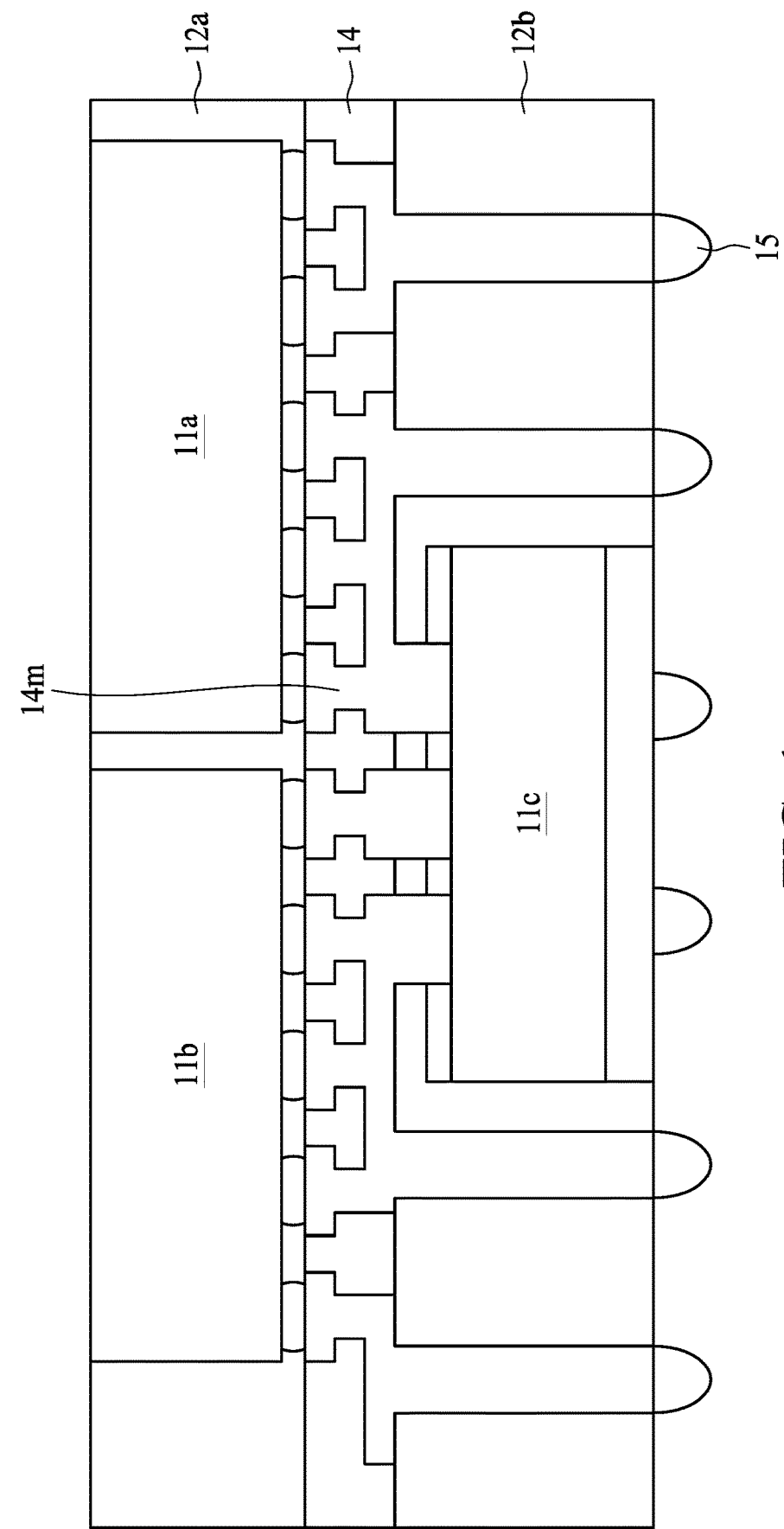
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device package 1 in accordance with some embodiments of the present disclosure. The semiconductor device package 1 includes electronic components 11a, 11b and 11c, an interconnection layer 14, and a conductive connection 14m, which could be deposited on a substrate. The substrate may be a flexible substrate or a rigid substrate, depending upon the specific application.

Each of the electronic components 11a, 11b and 11c includes a plurality of semiconductor devices, such as, but not limited to, transistors, capacitors and resistors interconnected together by a die interconnection structure into functional circuits to thereby form an integrated circuit. In some embodiments, the electronic component 11c is configured to perform computing or signal transmission between the electronic components 11a and 11b. The electronic component 11c is arranged below the electronic components 11a and 11b. Therefore, the semiconductor device package 1 has a relatively large thickness, which may hinder the miniaturization of the semiconductor device package 1

In some embodiments, the electronic components 11a, 11b are covered or encapsulated by a package body 12a. In some embodiments, the package body 12a includes an epoxy resin including filler therein, a molding compound (e.g., an epoxy molding compound or other molding compound), a polyimide, a phenolic compound or material, a material including a silicone dispersed therein, or a combination thereof.

The interconnection layer 14 includes electrical contacts (such as micro-pads) to which the electronic components 11a, 11b are electrically connected. In some embodiments, the interconnection layer 14 is a dielectric layer or a non-silicon interposer (e.g., an organic interposer) and includes a plurality of conductive connection 14m embedded therein.

In some embodiments, the electronic component 11a is disposed on the conductive connection 14m. The electronic component 11b is disposed adjacent to the electronic component 11a and on the conductive connection 14m. The electronic component 11a is electrically connected to the electronic component 11b through the conductive connection 14m and the electronic component 11c.

The package body 12b covers or encapsulates the electronic component 11c and a portion of the conductive connection 14m. The interconnection layer 14 is disposed on the package body 12b. The package body 12b includes an epoxy resin including filler therein, a molding compound (e.g., an epoxy molding compound or other molding compound), a polyimide, a phenolic compound or material, a material including a silicone dispersed therein, or a combination thereof.

The electronic component 11c and the package body 12b have different coefficients of thermal expansion (CTE). Because the electronic component 11c is encapsulated by the package body 12b, wafer warpage may occur during the manufacturing process (e.g., the RDL, passivation or other processes) due to the mismatch of CTE between the electronic component 11c and the package body 12b. This may adversely affect the performance of the semiconductor device package 1.

Figure 2:
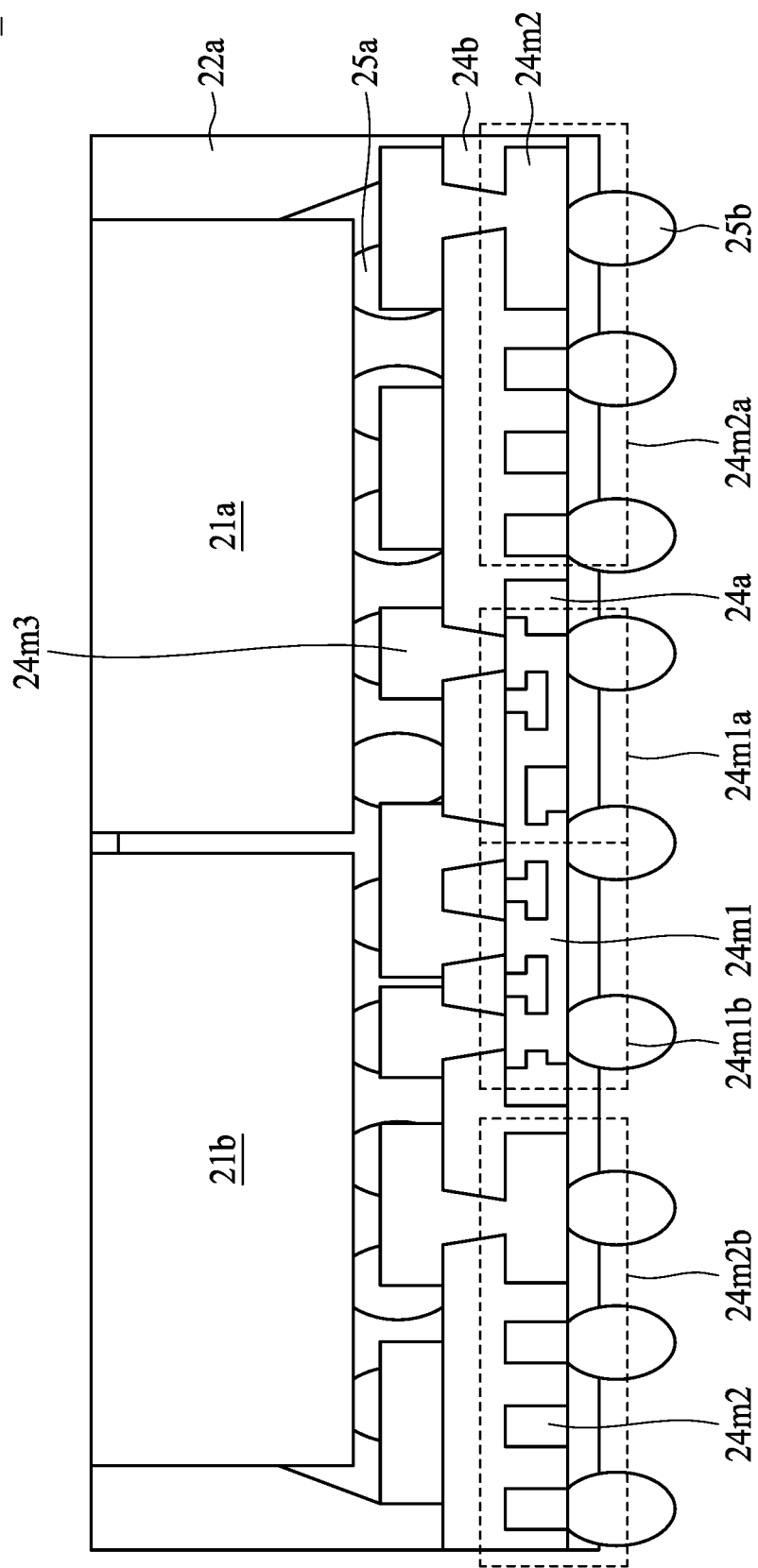
FIG. 2 is a cross-sectional view of another semiconductor device package in accordance with some embodiments of the present disclosure.

FIG. 2 is a cross-sectional view of a semiconductor device package 2 in accordance with some embodiments of the present disclosure. The semiconductor device package 2 includes electronic components 21a and 21b, interconnection layers 24a and 24b, and conductive connection 24m1, 24m2 and 24m3.

Each of the electronic components 21a, 21b includes a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnection. The electronic components 21a, 21b may be any suitable integrated circuit device including, but not limited to, a microprocessor (e.g., single or multi-core), a memory device, a chipset, a graphics device, a high bandwidth memory (HBM), or an application-specific integrated circuit (ASIC) according to several different embodiments. In some embodiments, the electronic component 21a is referred to as a first die, and the electronic component 21b is referred to as a second die.

In some embodiments, a plurality of electrical contacts 25a are disposed on active surfaces of the electronic components 21a and 21b to provide electrical connection between the electronic components 21a, 21b and other electronic components.

In some embodiments, the electronic components 21a, 21b are covered or encapsulated by a package body 22a. The package body 22a includes an epoxy resin including filler therein, a molding compound (e.g., an epoxy molding compound or other molding compound), a polyimide, a phenolic compound or material, a material including a silicone dispersed therein, or a combination thereof. The package body 22a includes a portion of conductive connection 24m3 embedded therein. The package body 22a covers or encapsulates the interconnection layer 24b (e.g., a top surface of the interconnection layer 24b). For example, the package body 22a is disposed on and adjacent to the interconnection layer 24b.

The interconnection layer 24b includes electrical contacts (such as micro-pads) to which the electronic components 21a, 21b are electrically connected. In some embodiments, the interconnection layer 24b is a dielectric layer or a non-silicon interposer (e.g., an organic interposer) and includes a plurality of conductive connection 24m3 embedded therein.

In some embodiments, the interconnection layer 24b covers or encapsulates the interconnection layer 24a. For example, the interconnection layer 24b is disposed on and surrounds the interconnection layer 24a. For example, the interconnection layer 24b is in contact with a top surface and lateral surfaces of the interconnection layer 24a. In some embodiments, the material of the interconnection layer 24a is different from the material of the interconnection layer 24b. More specifically, a hardness of the interconnection layer 24a is greater than a hardness of the interconnection layer 24b.

The interconnection layer 24a includes a plurality of conductive connection (or a redistribution layer (RDL)) 24m1 therein. A portion of the conductive connection 24m1 of the interconnection layer 24a is electrically connected to the conductive connection 24m3 of the interconnection layer 24b. For example, the conductive connection 24m1 that are electrically connected to the electronic components 21a, 21b are electrically connected to the conductive connection 24m3 of the interconnection layer 24b.

The interconnection layer 24a provides interconnection between the electronic components 21a and 21b. The conductive connection 24m1 is fine trace embedded within the interconnection layer 24a. In some embodiments, the line/space (L/S) of the conductive connection 24m1 is less than that of the conductive connection 24m2 or 24m3. The interconnection layer 24a can serve as a bridge between the electronic components 21a and 21b to transmit data with relatively high speed rate therebetween. Compared to the embodiments of FIG. 1, which uses the electronic component 11c as an interconnection bridge (or link), the interconnection bridge between the electronic components 21a and 21b of the semiconductor device package 2 is achieved by the conductive connection 24m1, which would reduce the thickness of the semiconductor device package 2.

In some embodiments, the electronic component 21a is disposed on the conductive connection 24m3. The electronic component 21b is disposed adjacent to the electronic component 21a and on the conductive connection 24m3. The electronic component 21a is electrically connected to the electronic component 21b through the conductive connection 24m1 and 24m3.

As shown in FIG. 2, the electronic component 21a is disposed over a portion 24m1a of the conductive connection 24m1 and a portion 24m2a of the conductive connection 24m2 adjacent to the portion 24m1a of the conductive connection 24m1. In other words, the portion 24m2a of the conductive connection 24m2 is arranged below the electronic component 21a. The portion 24m1a of the conductive connection 24m1 is adjacent to but not in direct contact with the portion 24m2a of the conductive connection 24m2. The electronic component 21b is disposed over a portion 24m1b of the conductive connection 24m1 and a portion 24m2b of the conductive connection 24m2 is adjacent to the portion 24m1b of the conductive connection 24m1. In other words, the portion 24m2b of the conductive connection 24m2 is arranged below the electronic component 21b. The portion 24m1b of the conductive connection 24m1 is adjacent to but not in direct contact with the portion 24m2b of the conductive connection 24m2.

In some embodiments, the conductive connection 24m1 is referred to as a first conductive layer, the conductive connection 24m2 is referred to as a second conductive layer, the conductive connection 24m3 is referred to as a third conductive layer, the interconnection layer 24a is referred to as a first dielectric layer, and the interconnection layer 24b is referred to as a second dielectric layer.

In some embodiments, the conductive connection 24m1 has a first pitch (e.g., L/S). The conductive connection 24m2 has a second pitch. The conductive connection 24m3 has a third pitch and disposed above the conductive connection 24m1 and the conductive connection 24m2. The conductive connection 24m3 electrically connected to the conductive connection 24m1. The first pitch is smaller than the third pitch, and the third pitch is smaller than the second pitch.

For example, the conductive connection 24m1 of the interconnection layer 24a is a fine-pitch interconnection or fine line. The conductive connection 24m3 of the interconnection layer 24b is a middle-pitch interconnection or middle line. The conductive connection 24m2 of the interconnection layer 24b is a coarse-pitch interconnection or coarse line. In other words, density of the conductive connection 24m1 is larger than density of the conductive connection 24m3. Density of the conductive connection 24m3 is larger than density of the conductive connection 24m2.

In some embodiments, a top surface of the conductive connection 24m1 is substantially coplanar with a top surface of the conductive connection 24m2. In other embodiments, the top surface of the conductive connection 24m1 is slightly higher than the top surface of the conductive connection 24m2 in order to electrically connect the conductive connection 24m3. In some embodiments, a diameter of the conductive connection 24m1 is less than a diameter of the conductive connection 24m2 or the conductive connection 24m3.

The conductive connection 24m1, 24m2, 24m3 provide interconnection between the electronic components 21a and 21b. The interconnection layer 24a can serve as a bridge or link between the electronic components 21a and 21b. In the embodiment of FIG. 1, the electronic component 11c is encapsulated by the package body 12b, which could result in wafer warpage during the manufacturing process (e.g., the RDL, passivation or other processes) due to the mismatch of CTE between the electronic component 11c and the package body 12b. This may adversely affect the performance of the semiconductor device package 1. Compared to the embodiment of FIG. 1, the interconnection bridge between the electronic components 21a and 21b of the semiconductor device package 2 is achieved by the conductive connection 24m1 without arranging another electronic component and its associated package body, which would prevent the semiconductor device package 2 from wafer warpage.

Figure 3:
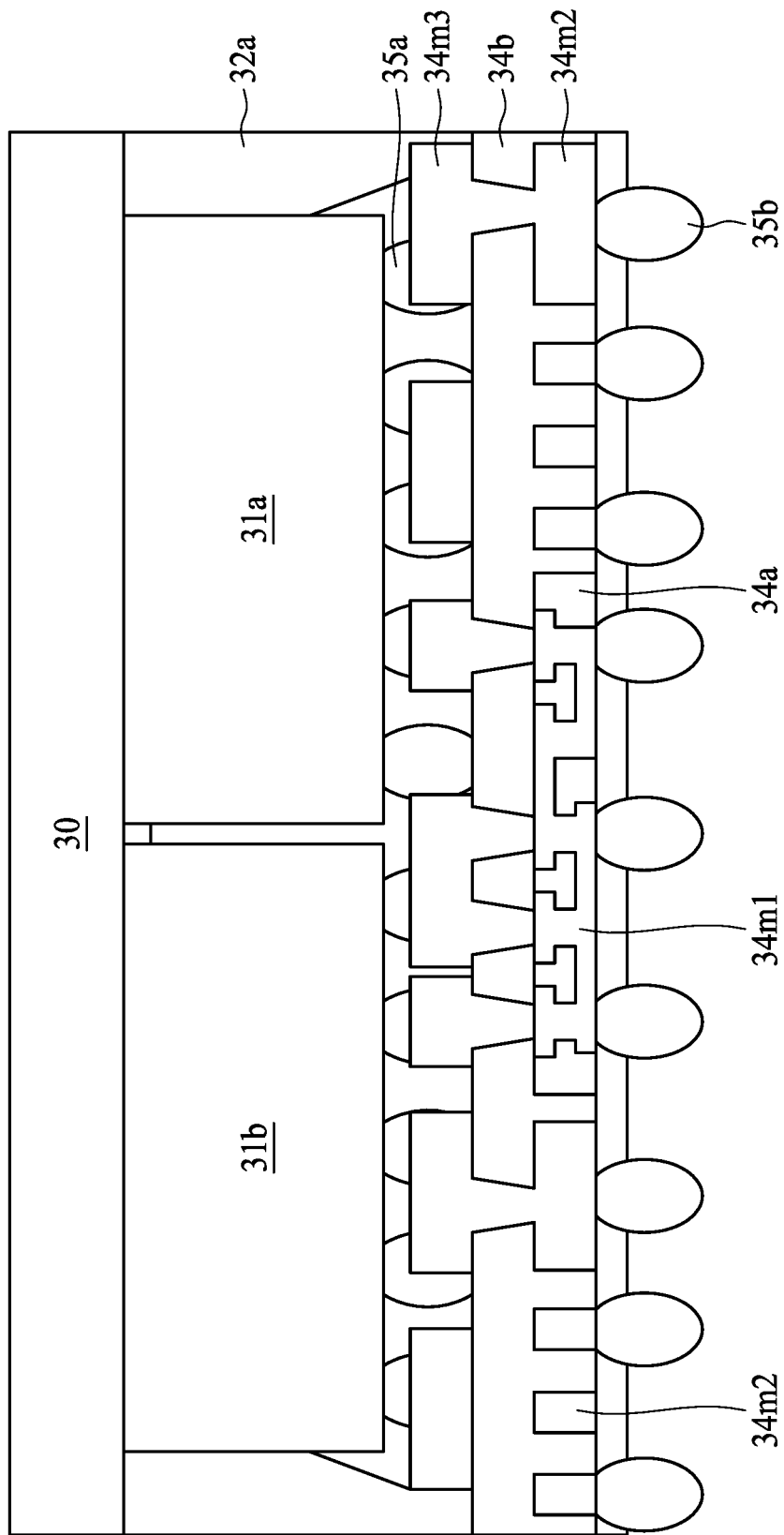
FIG. 3 is a cross-sectional view of another semiconductor device package in accordance with some embodiments of the present disclosure.

FIG. 3 is a cross-sectional view of another semiconductor device package 3 in accordance with some embodiments of the present disclosure. The semiconductor device package 3 is similar to the semiconductor device package 2 except that in FIG. 3, a carrier 30 is disposed on the electronic components 31a and 31b to cover or protect the semiconductor device package 3. In some embodiments, the carrier 30 may be a glass carrier or any other type of suitable carrier.

FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate various stages of a method for manufacturing a semiconductor device package 4 accordance with some embodiments of the subject application. Various figures have been simplified for a better understanding of the aspects of the present disclosure.

Figure 4A:
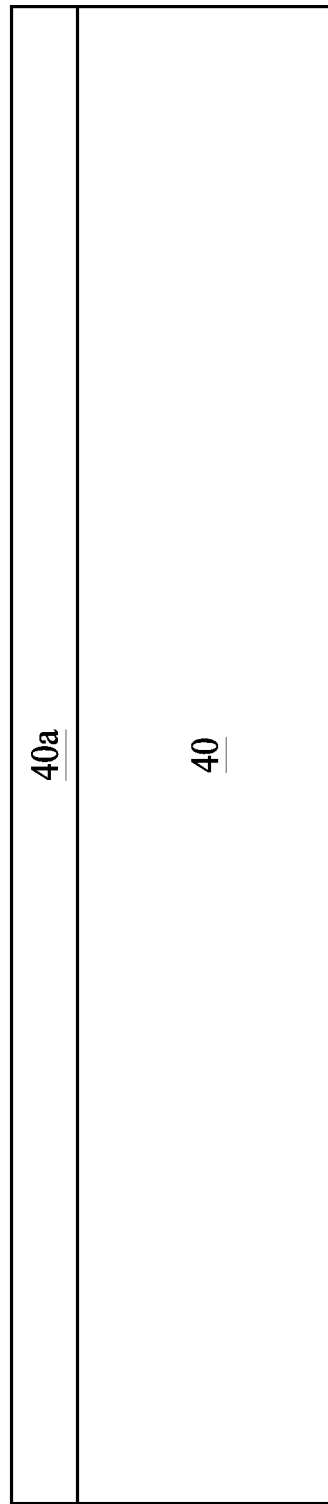
FIG. 4A, FIG. 4B, FIG. 4C, FIG. 4D, FIG. 4E, FIG. 4F, FIG. 4G, FIG. 4H, FIG. 4I, FIG. 4J and FIG. 4K illustrate various stages of a method for manufacturing a semiconductor device package accordance with some embodiments of the subject application.

Referring to FIG. 4A, a carrier 40 is provided, and an adhesive layer (or a release film) 40a is formed or deposited on the carrier 40. In some embodiments, the carrier 40 may be a glass carrier or any other type of suitable carrier.

Figure 4B:
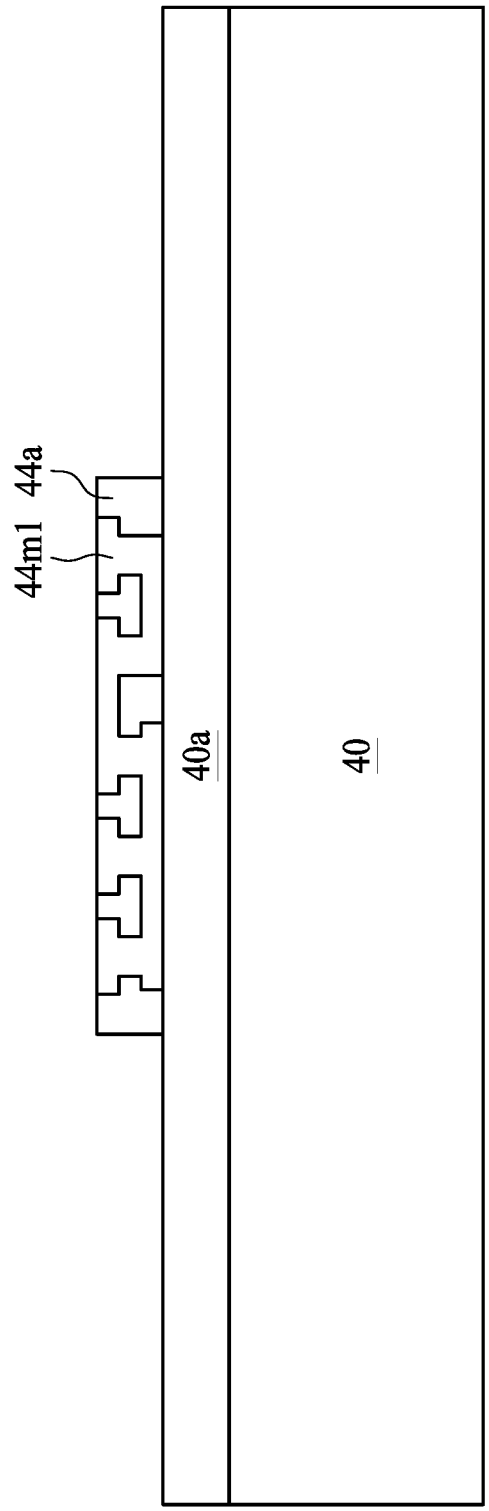

Referring to FIG. 4B, the interconnection layer 44a is attached to the carrier 40 through the adhesive layer 40a on the carrier 40. In some embodiments, the interconnection layer 44a does not completely cover the carrier 40. For example, the interconnection layer 44a covers a portion of the carrier 40 and exposes another portion of the carrier 40. In addition, the interconnection layer 44a covers or encapsulates the conductive connection 44m1.

Figure 4C:
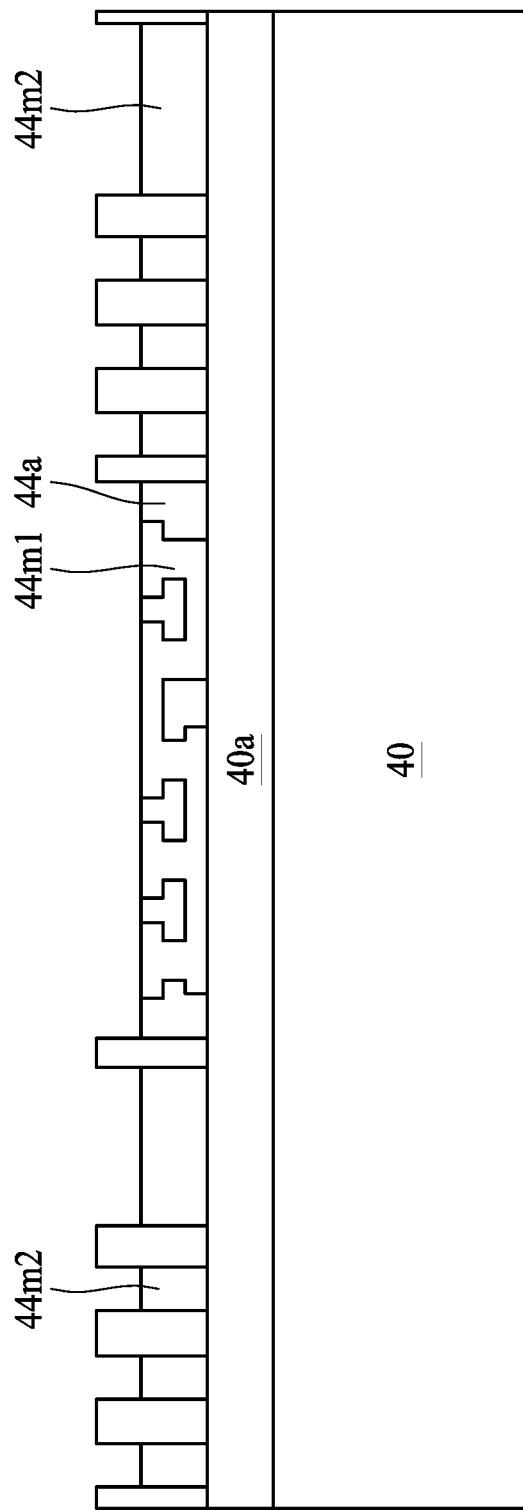

Referring to FIG. 4C, the conductive connection 44m2 is formed or deposited on the carrier 40 and the adhesive layer 40a. The conductive connection 44m2 is formed on two different sides of the interconnection layer 44a to surround the conductive connection 44m1 and the interconnection layer 44a. The conductive connection 44m2 could also be embedded within a dielectric layer.

In some embodiments, the conductive connections 44m1 and 44m2 are formed by electroplating or by other suitable techniques. The conductive connections 44m1 and 44m2 have different pitches. In some embodiments, the conductive connection 44m2 is coarse-pitch interconnection or coarse line, and the conductive connection 44m1 is fine-pitch interconnection or fine line.

Figure 4D:
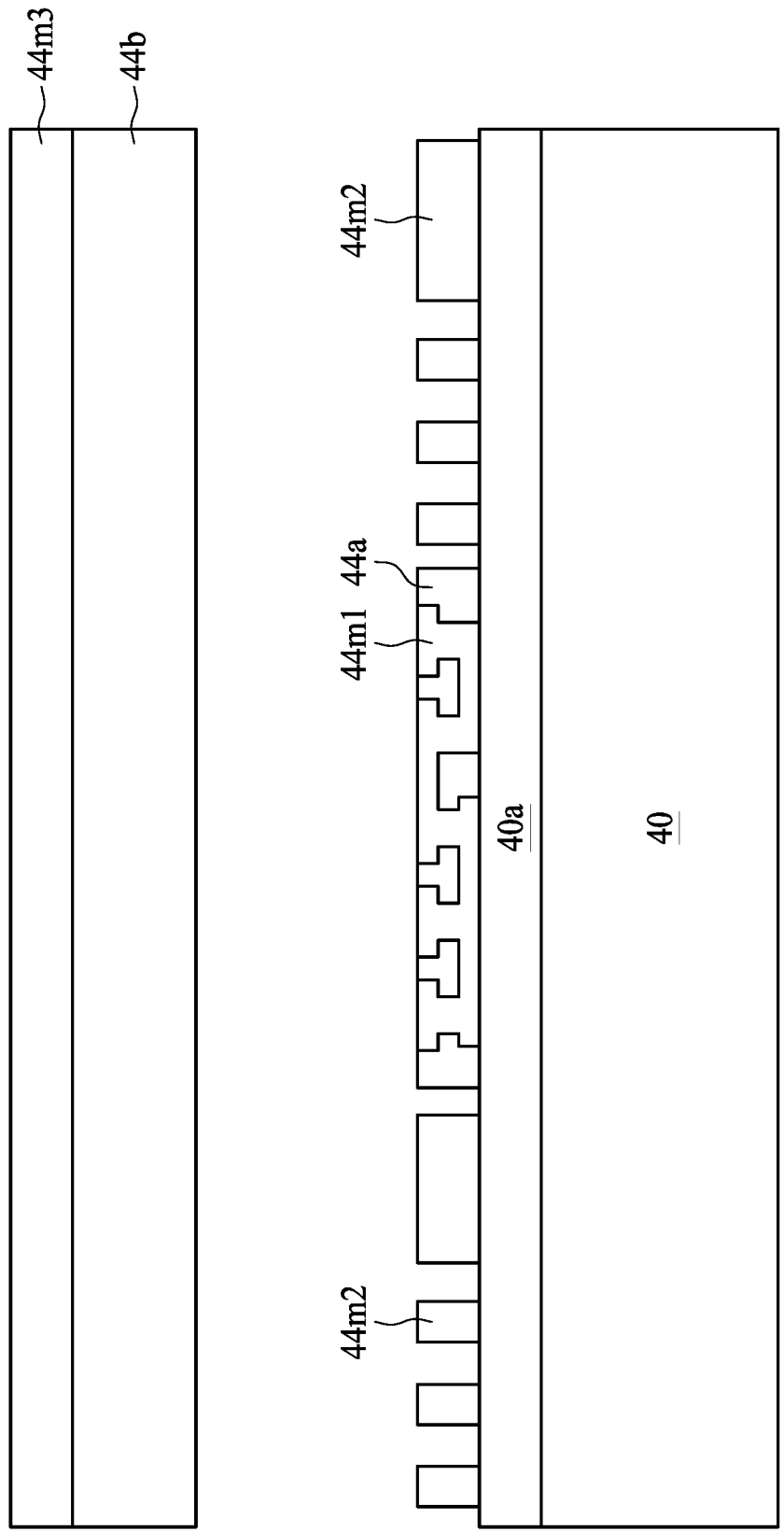

Referring to FIG. 4D, the conductive connection 44m3 is formed or deposited on the interconnection layer 44b. The conductive connection 44m3 and the interconnection layer 44b are formed or deposited on the interconnection layer 44a and the conductive connections 44m1, 44m2 in order to provide electrical connections between the conductive connections 44m1, 44m2 and 44m3. Hardness of the interconnection layer 44b is smaller than that of the interconnection layer 44a.

Figure 4E:
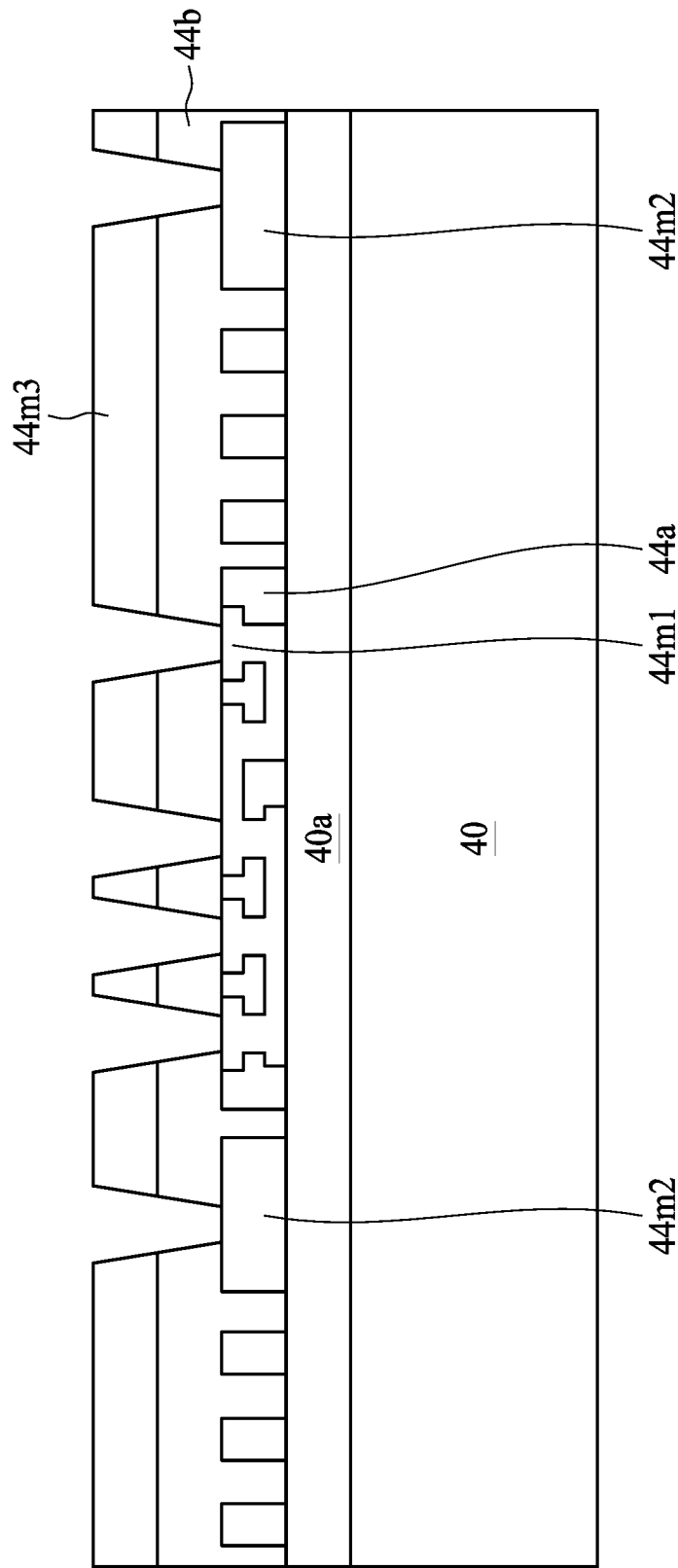

Referring to FIG. 4E, etching, grinding or other suitable process is performed of the conductive connection 44m3 and the interconnection layer 44b. For example, laser drill is executed for the conductive connection 44m3 and the interconnection layer 44b to develop a plurality of openings or trenches.

Figure 4F:
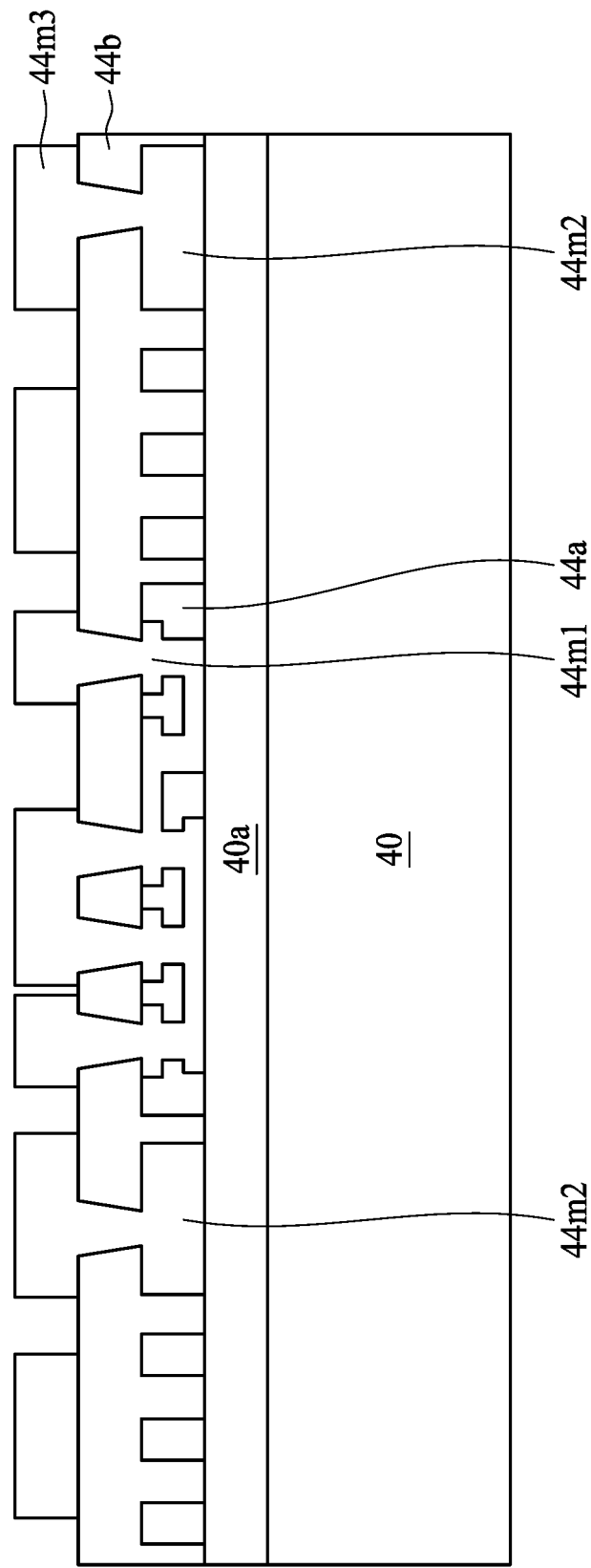

Referring to FIG. 4F, via plating or metal plating is performed corresponding to the developed openings or trenches. A portion of the conductive connections 44m3 directly contacts the conductive connections 44m1. The pitch of the conductive connections 44m1 is smaller than the pitch of the conductive connections 44m3, and the pitch of the conductive connections 44m3 is smaller than the pitch of the conductive connections 44m2.

Figure 4G:
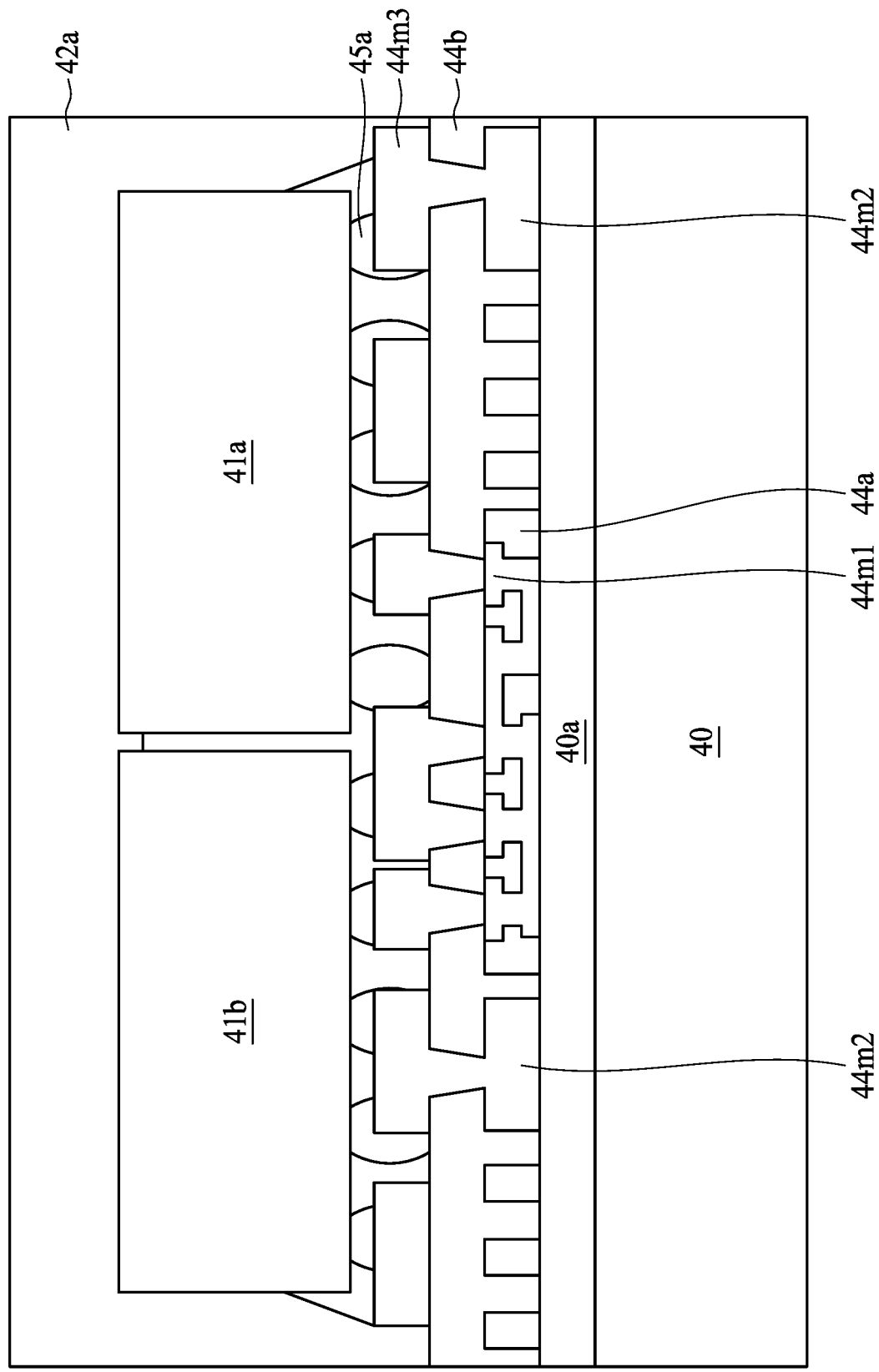

Referring to FIG. 4G, the electronic components 41a and 41b are formed or disposed on the interconnection layer 44b and electrically connected to the conductive connections 44m3. Each of the electronic components 41a and 41b includes a plurality of electrical contacts 45a to provide electrical connections between the electronic components 41a and 41b and conductive connection 44m3.

A package body 42a is then formed or disposed to cover or encapsulate the electronic components 41a and 41b. In some embodiments, the package body 42a includes an epoxy resin including fillers, a molding compound (e.g., an epoxy molding compound or other molding compound), a polyimide, a phenolic compound or material, a material including a silicone dispersed therein, or a combination thereof.

Figure 4H:
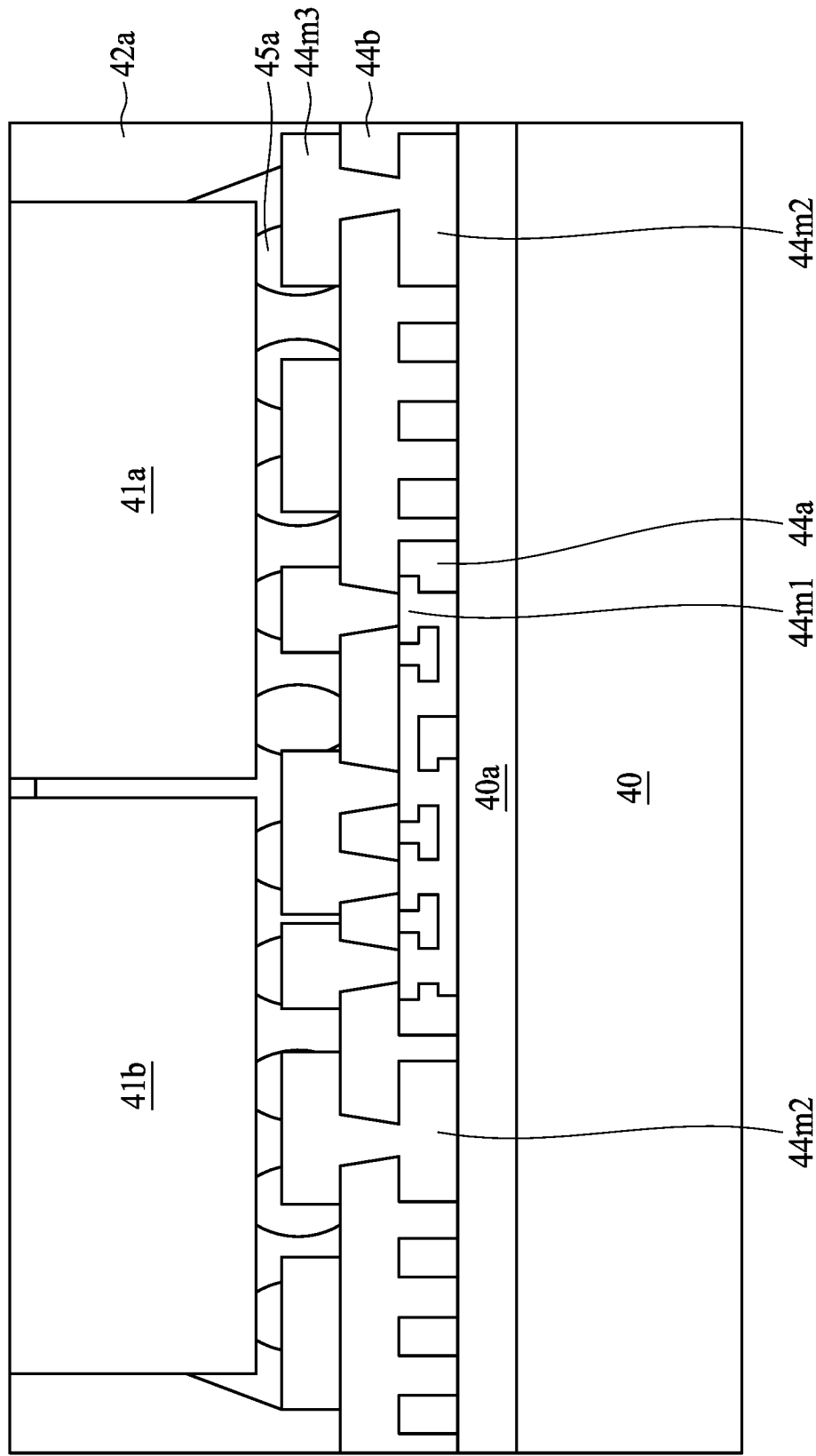

Referring to FIG. 4H, a portion of the package body 42a is removed so that a backside of each electronic component 41a and 41b is exposed from the package body 42a. In some embodiments, the package body 42a can be removed by grinding, etching or by other suitable processes.

Figure 4I:
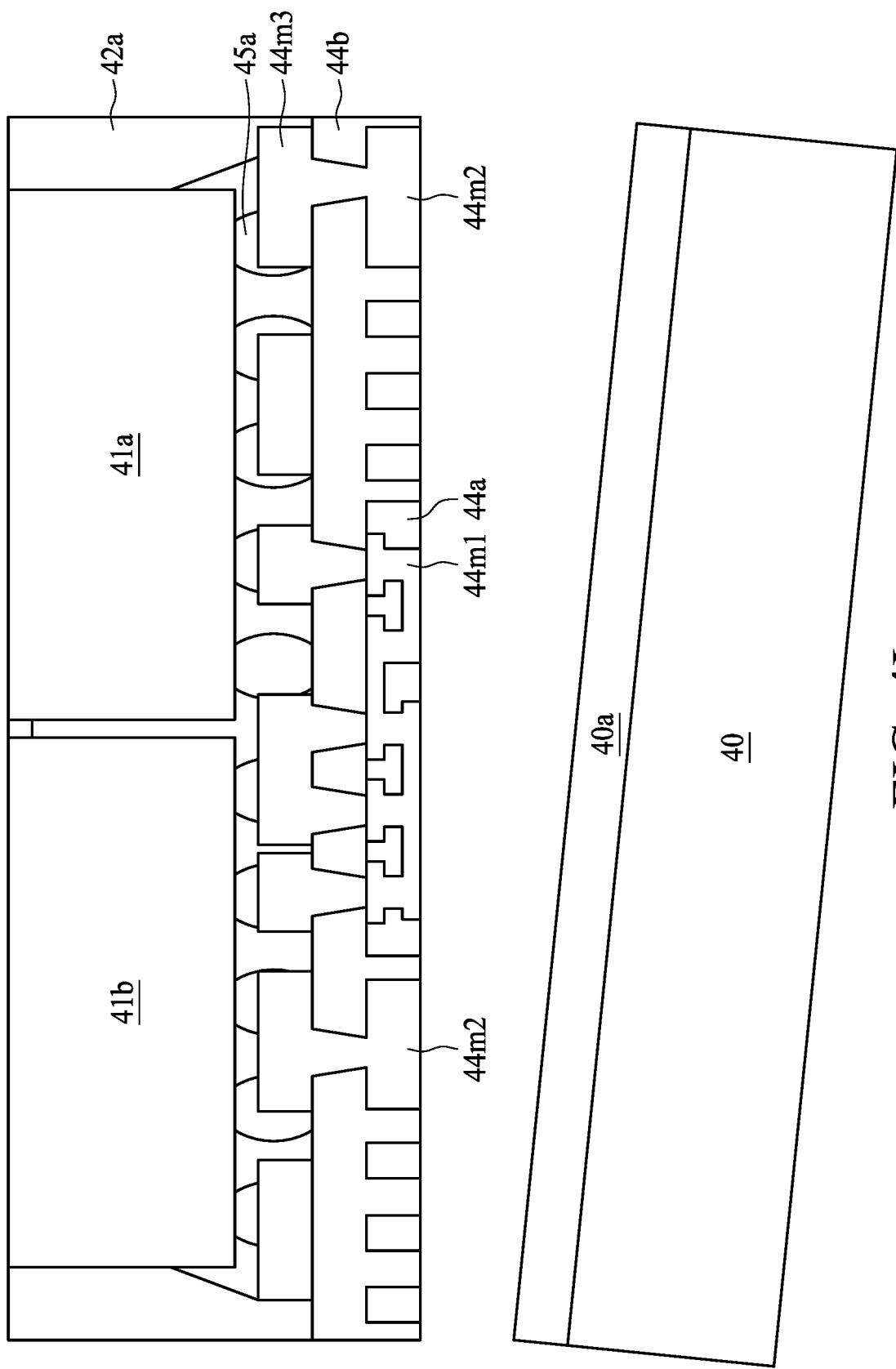
Figure 4J:
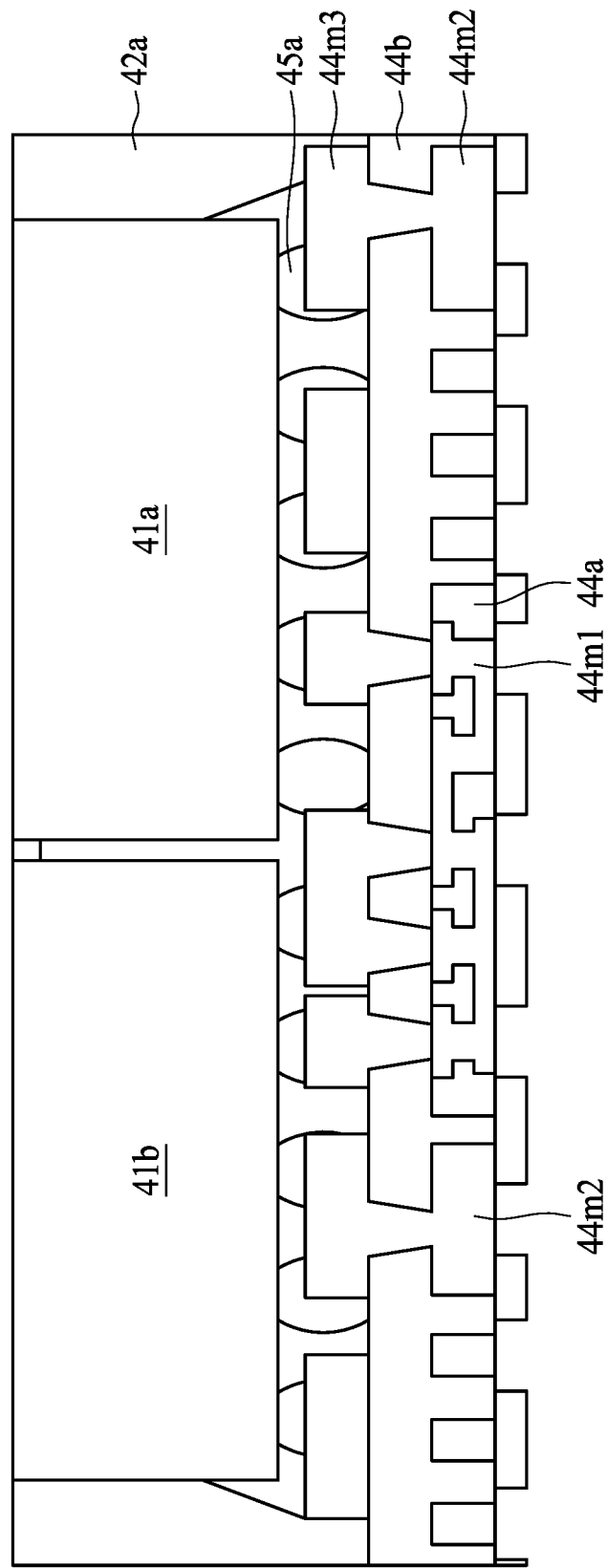
Figure 4K:
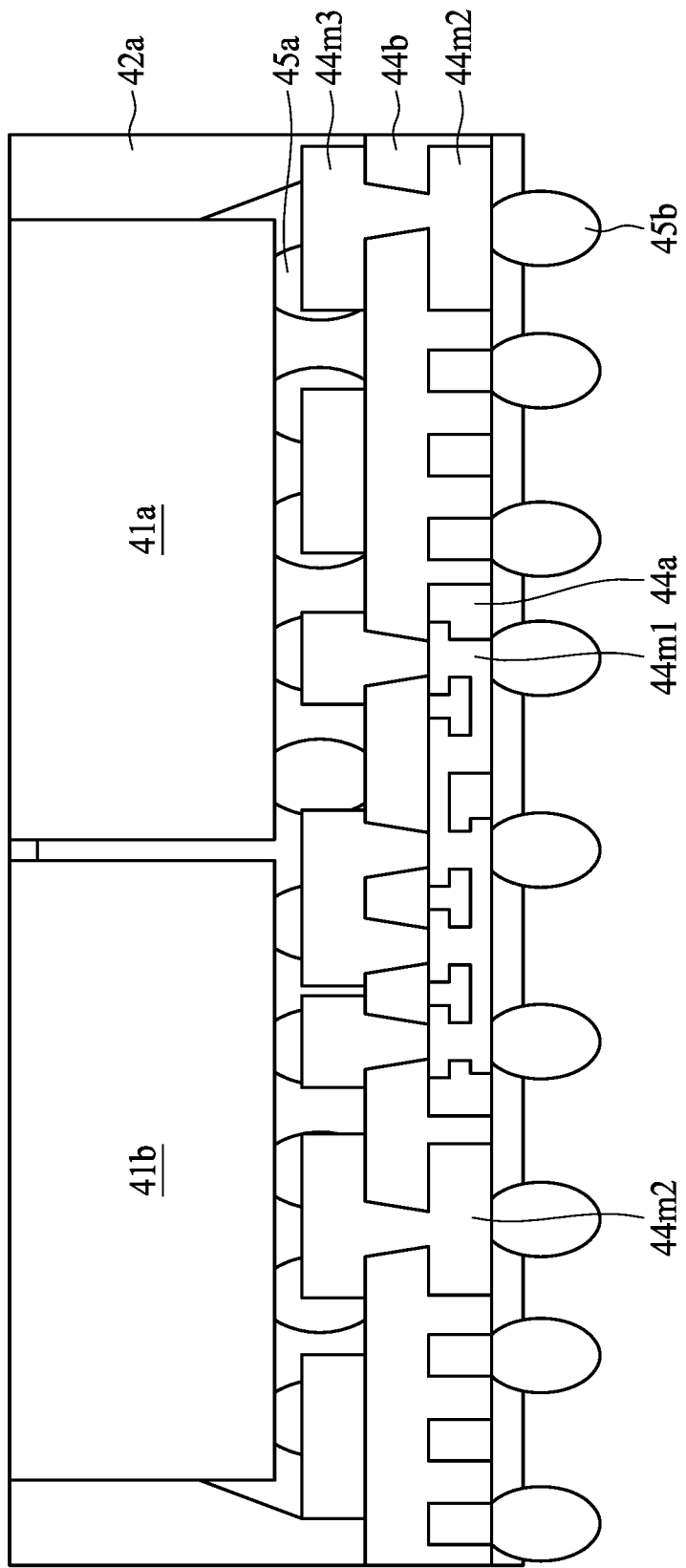

Referring to FIG. 4I and FIG. 4J, the carrier 40 and the adhesive layer 40a are then removed from the interconnection layers 44a and 44b to expose the conductive connections 44m1 and 44m2. Referring to FIG. 4K, a plurality of solder balls 45b are formed below to electrically connect the conductive connections 44m1 and 44m2.

The conductive connection 44m1 is embedded within the interconnection layer 44a to provide electrical connection between the electronic components 41a and 41b. The interconnection layer 44a can serve as a bridge between the electronic components 41a and 41b. Therefore, the thickness could be reduced without arranging additional electronic component under the electronic components 41a and 41b. The wafer warpage due to CTE mismatch could also be improved or eliminated.

FIG. 5A, FIG. 5B, FIG. 5C, FIG. 5D, FIG. 5E, FIG. 5F and FIG. 5G illustrate various stages of a method for manufacturing another semiconductor device package 5 accordance with some embodiments of the subject application. Various figures have been simplified for a better understanding of the aspects of the present disclosure.

Figure 5A:
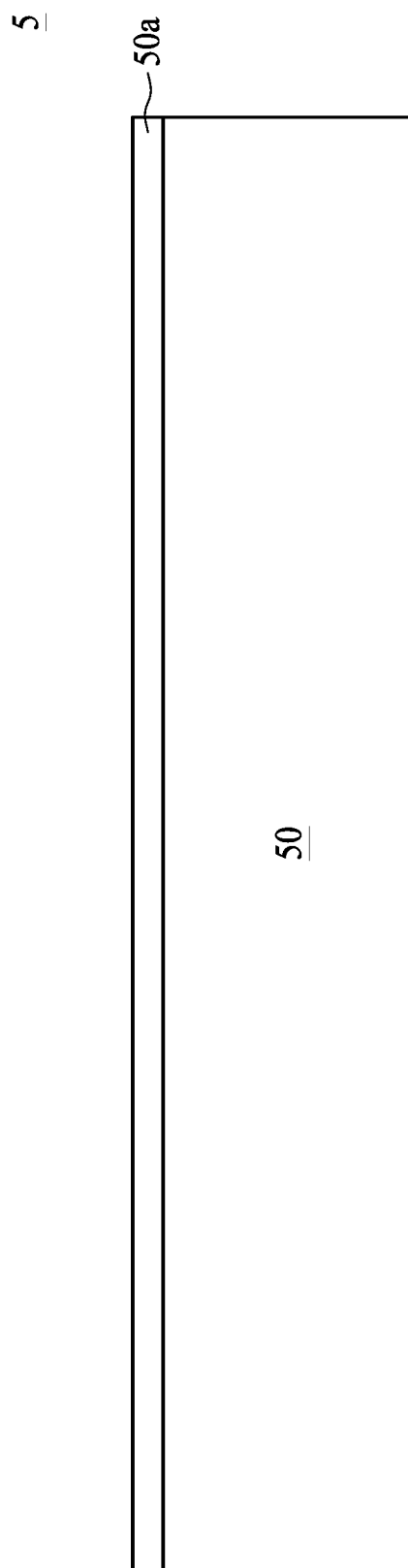
FIG. 5A, FIG. 5B, FIG. 5C, FIG. 5D, FIG. 5E, FIG. 5F and FIG. 5G illustrate various stages of a method for manufacturing another semiconductor device package accordance with some embodiments of the subject application.
Figure 5B:
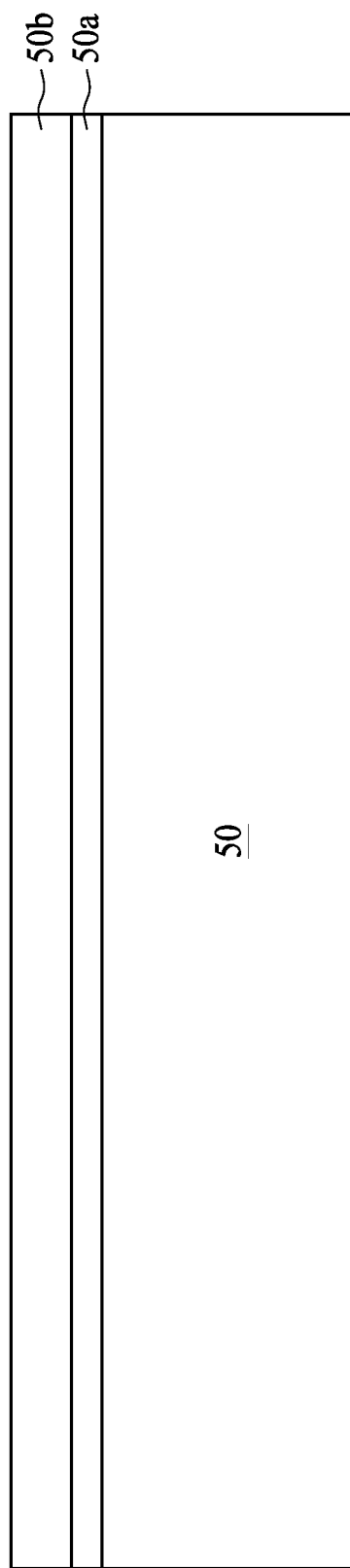

Referring to FIG. 5A, a carrier 50 is provided, and an adhesive layer (or a release film) 50a is formed or deposited on the carrier 40. In some embodiments, the carrier 40 may be a glass carrier or any other type of suitable carrier. Referring to FIG. 5B, an adhesive layer (or a release film) 50b is formed or deposited on the adhesive layer 50a.

Figure 5C:
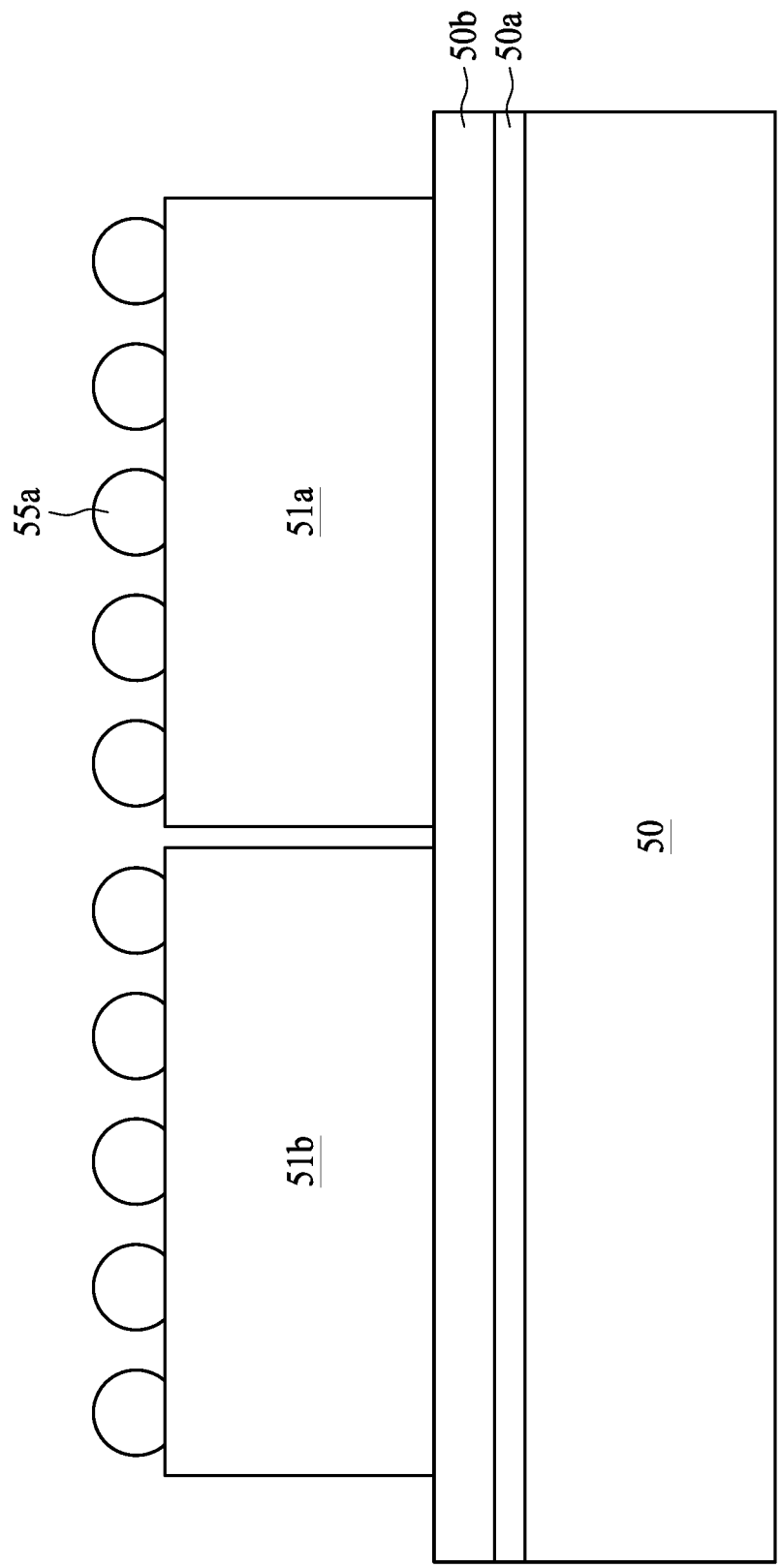

Referring to FIG. 5C, the electronic components 51a and 51b are formed or disposed on the adhesive layer 50b. Each of the electronic components 51a and 51b includes a plurality of electrical contacts 55a to provide electrical connections between the electronic components 51a and 51b.

Figure 5D:
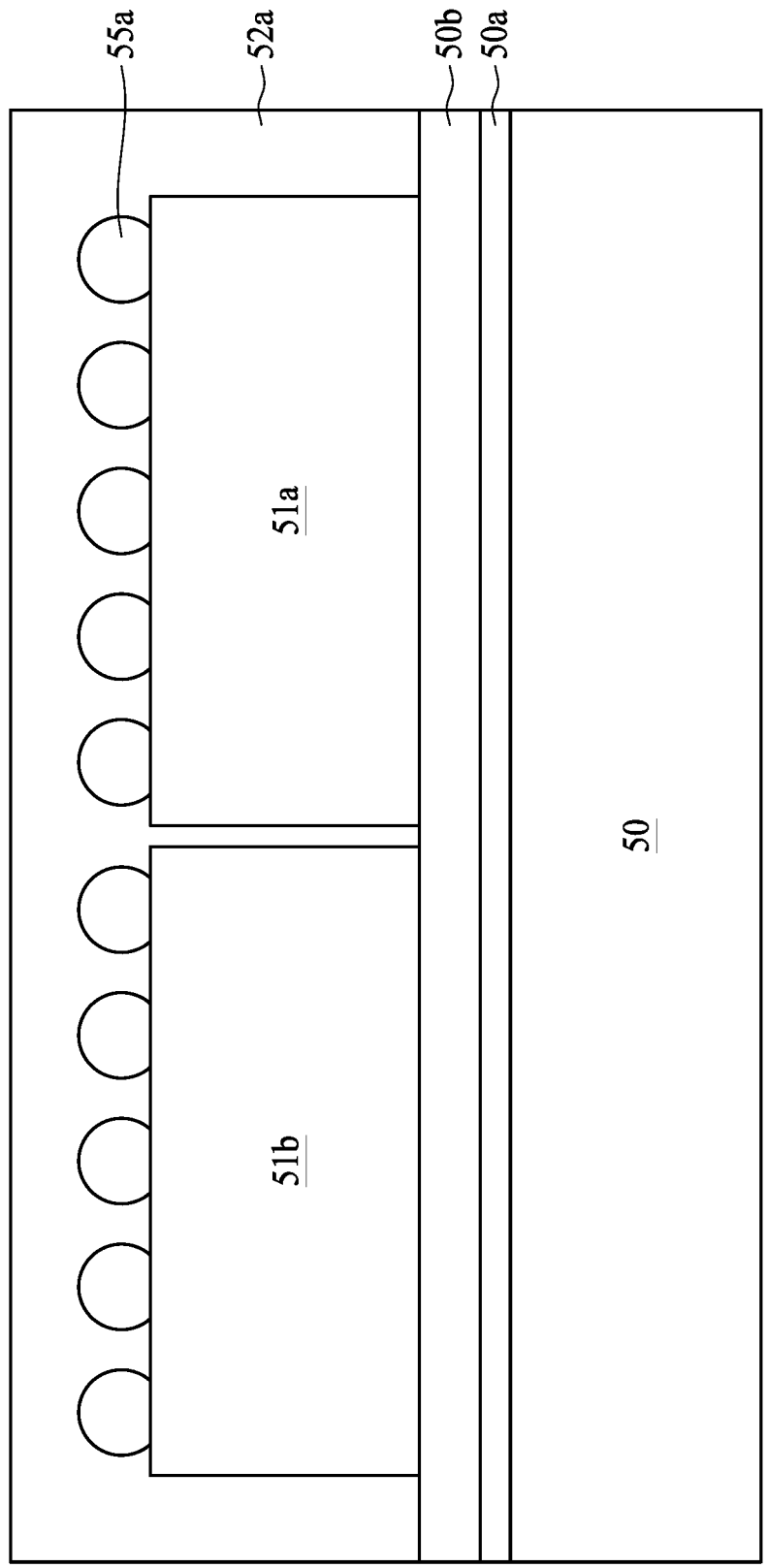

Referring to FIG. 5D, package body 52a is then formed or disposed to cover or encapsulate the electronic components 51a and 51b. In some embodiments, the package body 52a includes an epoxy resin including fillers, a molding compound (e.g., an epoxy molding compound or other molding compound), a polyimide, a phenolic compound or material, a material including a silicone dispersed therein, or a combination thereof.

Figure 5E:
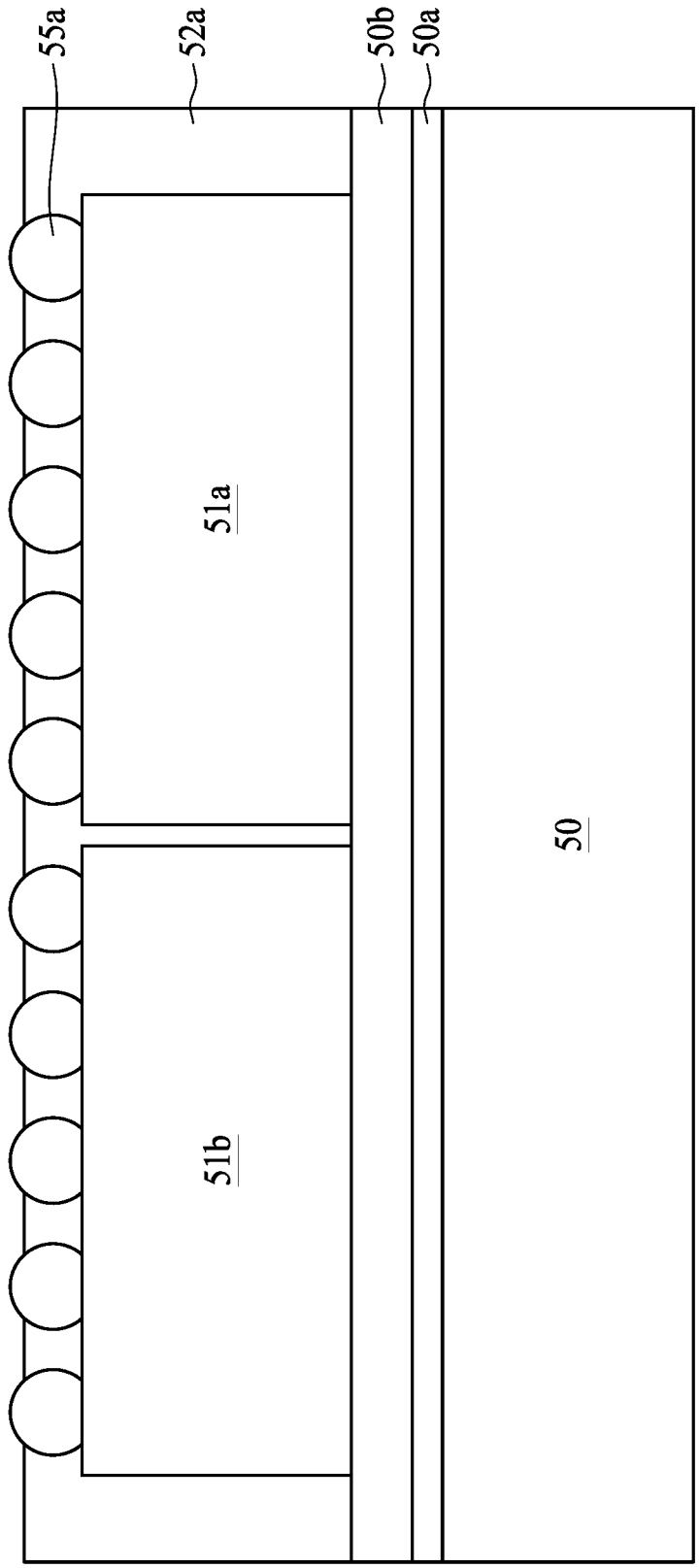

Referring to FIG. 5E, a portion of the package body 52a is removed so that a plurality of electrical contacts 55a is exposed from the package body 52a. In some embodiments, the package body 52a can be removed by grinding, etching or by other suitable processes.

Figure 5F:
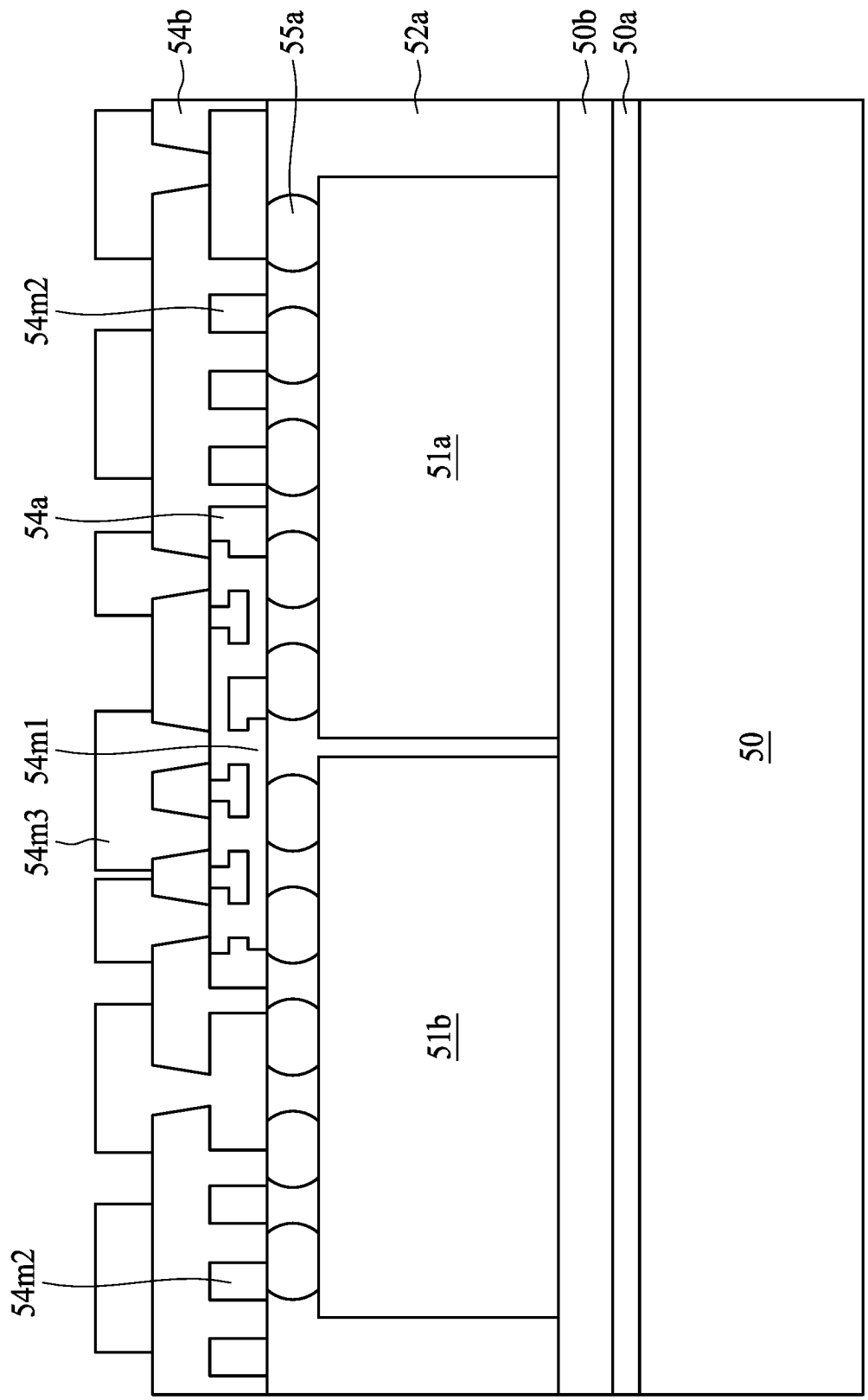

Referring to FIG. 5F, interconnection layer 54a is formed or deposited on the package body 52a and the electrical contacts 55a. the interconnection layer 54a covers or encapsulates the conductive connection 54m1. The conductive connection 54m2 is formed on two different sides of the interconnection layer 54a to surround the conductive connection 54m1 and the interconnection layer 54a. The conductive connection 54m3 is formed or deposited on the interconnection layer 54b and the conductive connection 54m1 in order to provide electrical connections between the conductive connections 54m1, 54m2 and 54m3.

In some embodiments, the conductive connections 54m1, 54m2 and 54m3 are formed by electroplating or by other suitable techniques. In some embodiments, the conductive connection 54m2 is coarse-pitch interconnection or coarse line, the conductive connection 54m3 is middle-pitch interconnection or middle line, and the conductive connection 54m1 is fine-pitch interconnection or fine line.

Figure 5G:
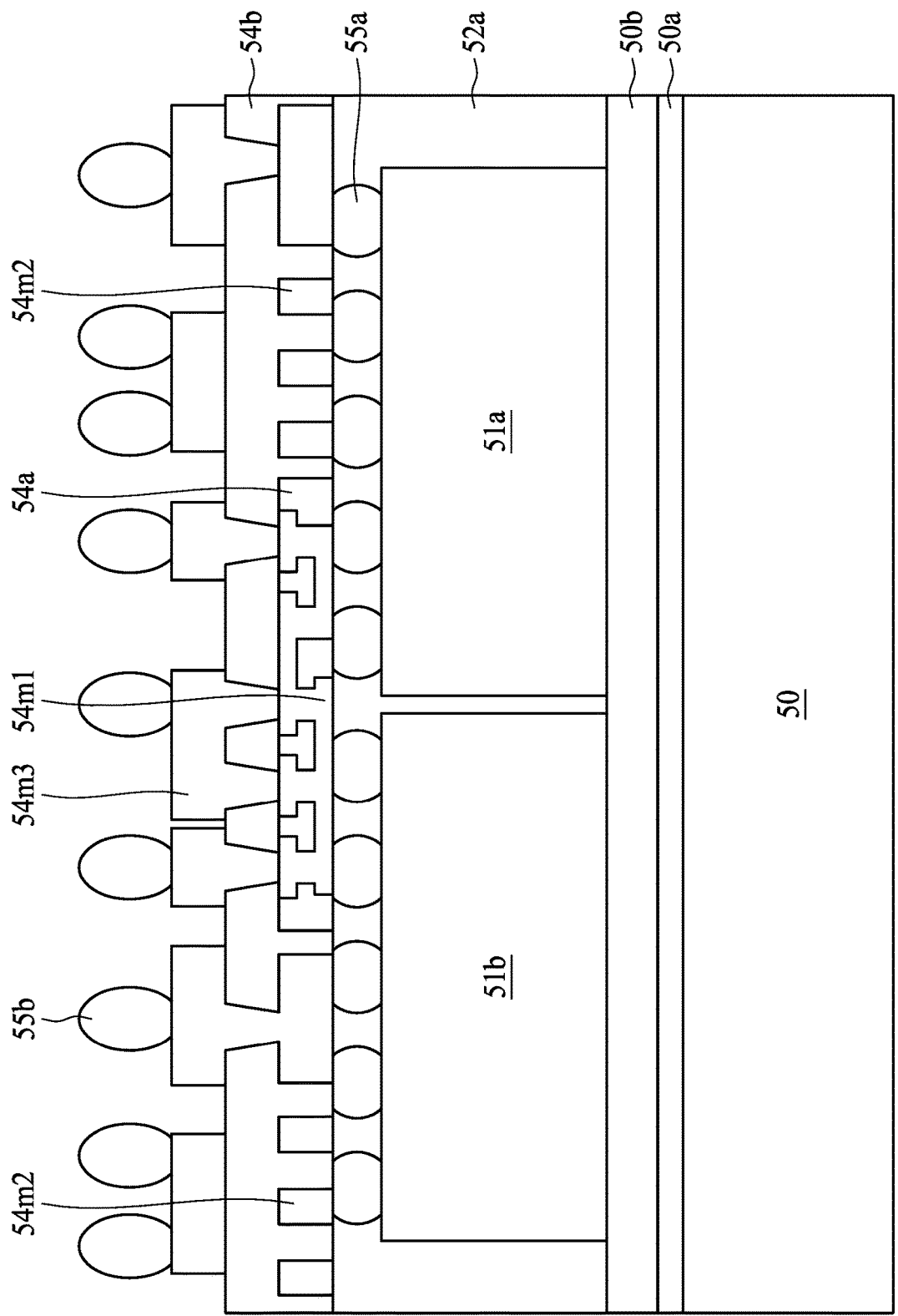

The conductive connection 54m1 is embedded within the interconnection layer 54a to provide electrical connection between the electronic components 51a and 51b. The interconnection layer 54a can serve as a bridge between the electronic components 51a and 51b. Therefore, the thickness could be reduced without arranging additional electronic component under the electronic components 51a and 51b. The wafer warpage due to CTE mismatch could also be improved or eliminated. Referring to FIG. 5G, a plurality of solder balls 55b are formed above the conductive connection 54m3 to electrically connect other semiconductor device packages.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

The invention claimed is:

1. A semiconductor device package, comprising:
   a first conductive layer having a first pitch;
   a second conductive layer having a second pitch and arranged adjacent to a side of the first conductive layer;
   a third conductive layer having a third pitch and disposed above the first conductive layer and the second conductive layer,
   wherein the first pitch is smaller than the third pitch, the third pitch is smaller than the second pitch, and the third conductive layer comprises a via tapered toward the second conductive layer; and
   a plurality of electronic components electrically connected to the first conductive layer through the third conductive layer.

2. The semiconductor device package of claim 1, wherein the first conductive layer vertically overlaps a gap between adjacent two electronic components of the plurality of electronic components.

3. The semiconductor device package of claim 2, wherein the first conductive layer serves as a bridge between the plurality of electronic components.

4. The semiconductor device package of claim 1, further comprising:
   a first dielectric layer laterally covering the first conductive layer and encapsulating the second conductive layer.

5. The semiconductor device package of claim 4, further comprising:
   a second dielectric layer encapsulating the first conductive layer, wherein the first dielectric layer further encapsulates the second dielectric layer.

6. The semiconductor device package of claim 5, wherein a surface of the first conductive layer is substantially co-level with a surface of the second dielectric layer.

7. The semiconductor device package of claim 1, wherein a surface of the first conductive layer is substantially co-level with a surface of the second conductive layer.

8. A semiconductor device package, comprising:
   a first conductive layer having a first pitch,
   a second conductive layer having a second pitch and arranged at a side of the first conductive layer, wherein the first pitch is smaller than the second pitch;
   a first dielectric layer encapsulating the first conductive layer;
   a second dielectric layer covering the second conductive layer,
   wherein the second dielectric layer is in contact with a lateral surface of the first dielectric layer; and
   a third conductive layer vertically overlapping the first conductive layer, and the second dielectric layer laterally covers at least a portion of the third conductive layer.

9. The semiconductor device package of claim 8, wherein the second dielectric layer encapsulates the second conductive layer.

10. The semiconductor device package of claim 9, wherein the second dielectric layer at least partially covers the first dielectric layer, and the first dielectric layer is exposed by the second dielectric layer.

11. The semiconductor device package of claim 8, wherein the portion of the third conductive layer laterally overlaps the first dielectric layer.

12. The semiconductor device package of claim 8, further comprising:
   a plurality of electronic components electrically connected to the first conductive layer,
   wherein the third conductive layer is electrically connected to the first conductive layer, and wherein the third conductive layer vertically overlaps a gap between adjacent two electronic components of the plurality of electronic components.

13. The semiconductor device package of claim 12, further comprising:
   an encapsulant encapsulating the plurality of electronic components, wherein a portion of the encapsulant is disposed in the gap, and the portion of the third conductive layer is spaced apart from the portion of the encapsulant.

14. A semiconductor device package, comprising:
   an interconnection layer having a bottom surface and a top surface opposite to the bottom surface;
   a first conductive layer embedded in the interconnection layer, wherein the first conductive layer is exposed by the top surface and the bottom surface of the interconnection layer; and
   a first electronic component electrically connected to the interconnection layer and vertically covering a lateral edge of the interconnection layer.

15. The semiconductor device package of claim 14, wherein a thickness of the interconnection layer is less than a thickness of the first electronic component.

16. The semiconductor device package of claim 14, further comprising:
   a second electronic component electrically connected to the interconnection layer; and
   an encapsulant encapsulating the first electronic component and the second electronic component, wherein a portion of the encapsulant is disposed in a gap between the first electronic component and the second electronic component.

17. The semiconductor device package of claim 14, wherein the bottom surface of the interconnection layer is substantially co-level with a bottom surface of the first conductive layer.

18. The semiconductor device package of claim 14, wherein a portion of the first electronic component does not vertically overlaps the interconnection layer.

* * * * *